US 6,563,296 B2

(12) United States Patent
Cooke

(10) Patent No.: US 6,563,296 B2
(45) Date of Patent: *May 13, 2003

(54) CLOSELY-COUPLED MULTIPLE-WINDING MAGNETIC INDUCTION-TYPE SENSOR

(76) Inventor: Chathan M. Cooke, 256 Grove St., Belmont, MA (US) 02178

( * ) Notice: Subject to any disclaimer, the term of this patent is extended or adjusted under 35 U.S.C. 154(b) by 0 days.

This patent is subject to a terminal disclaimer.

(21) Appl. No.: 10/152,062

(22) Filed: May 21, 2002

(65) Prior Publication Data
US 2002/0125877 A1 Sep. 12, 2002

Related U.S. Application Data

(63) Continuation of application No. 09/092,574, filed on Jun. 5, 1998, now Pat. No. 6,392,401.

(51) Int. Cl.[7] .......................... G01R 1/20; G01R 31/06; G01R 19/04
(52) U.S. Cl. .................. 324/127; 324/115; 324/117 R; 324/522; 324/547
(58) Field of Search ................ 324/127, 115, 324/646, 117 R, 546, 547, 536, 537, 522, 524, 140 R

(56) References Cited

U.S. PATENT DOCUMENTS

| 2,428,613 A | | 10/1947 | Boyajian | |
| 2,922,110 A | | 1/1960 | Miller | |
| 4,319,288 A | | 3/1982 | Lee | |
| 4,573,757 A | | 3/1986 | Cochran et al. | |
| 4,779,341 A | | 10/1988 | Roscizewski | |
| 4,818,967 A | | 4/1989 | Mikulecky | |
| 4,868,843 A | * | 9/1989 | Nunan ..................... | 250/505.1 |
| 4,887,041 A | | 12/1989 | Mashikian et al. | |
| 4,912,396 A | * | 3/1990 | Groenenboom ......... | 324/117 R |
| 4,914,382 A | | 4/1990 | Douville et al. | |
| 4,996,677 A | | 2/1991 | Naito et al. | |
| 5,075,629 A | | 12/1991 | Umemura et al. | |
| 5,272,439 A | | 12/1993 | Mashikian et al. | |
| 5,272,442 A | | 12/1993 | Schemmel et al. | |
| 5,392,172 A | | 2/1995 | Yoshinaga et al. | |
| 5,530,364 A | | 6/1996 | Mashikian et al. | |
| 5,600,112 A | | 2/1997 | Opfer | |
| 5,640,154 A | * | 6/1997 | Meyer et al. ............... | 324/544 |
| 5,652,521 A | * | 7/1997 | Meyer ......................... | 324/541 |
| 5,694,044 A | | 12/1997 | Crowley et al. | |
| 5,808,536 A | | 9/1998 | Sandlin, Jr. et al. | |
| 6,392,401 B1 | * | 5/2002 | Cooke ......................... | 324/115 |

FOREIGN PATENT DOCUMENTS

| JP | 1187465 | 7/1989 |
| JP | 5172555 | 7/1993 |

* cited by examiner

Primary Examiner—N. Le
Assistant Examiner—Anjan K. Deb
(74) Attorney, Agent, or Firm—Thomas J. Engellenner; Geoffrey S. Smith; Nutter McClennen & Fish LLP

(57) ABSTRACT

The invention relates to sensors for detecting a time-varying current by employing a plurality of coils with separate windings, disposed on separate toroidal cores, that are placed in close proximity of each other so that each coil responds independently to the same current. The current produces a time-varying magnetic field which in turn induces a plurality of voltages across the coils that can be combined to provide a resultant signal. Some embodiments of the invention employ coils with opposite windings to obtain signals with opposite phases and combine these signals through differential detection means to obtain a combined signal. One aspect of the invention relates to production of a wide-band or a selectable band-width sensor by preparing at least one coil to be dissimilar with respect to the others. In addition, the invention provides provisions for easy calibration of the sensor.

18 Claims, 5 Drawing Sheets

CLOSELY-COUPLED MULTIPLE-WINDING MAGNETIC INDUCTION-TYPE SENSOR

REFERENCE TO RELATED APPLICATIONS

This application is a continuation of U.S. patent application Ser. No. 09/092,574, filed Jun. 5, 1998, now U.S. Pat. No. 6,392,401.

BACKGROUND

This invention relates to methods and apparatus for detecting a time-varying current. In particular, the invention detects a transient current produced by a variety of physical mechanisms, e.g., a pulse of current carried on an electrical conductor, with a better signal-to-noise ratio than the existing current sensors provide.

One important application of the apparatus of the invention relates to the detection of a sudden localized redistribution of charge at a defective point of an insulation which is under high electric stress, e.g., electric power cables, high voltage transformers. Such a redistribution of charge leads to an intermittent arcing that signals the presence of a fault. The term fault, as used herein, refers both to an incipient fault which may not cause an immediate failure but may eventually lead to a failure, and also to a complete failure of the system. It is well-known that partial discharge events are common precursors to many significant failure modes in a variety of high voltage devices.

The early detection of an incipient fault through monitoring partial discharge events can prevent the occurrence of a complete failure which may result in considerable inconvenience and financial loss. For example, the failure of high voltage devices of a utility company such as transformers and high voltage distribution cables, especially during a critical period, can lead to enormous inconvenience for the customers and financial loss for the company.

The energy associated with a partial discharge event is typically extremely small. This energy is particularly small when the defect that gives rise to the partial discharge is at its early stages of development. Given the desirability of detecting defects at such early stages, it is evident that having a sensor that detects a pulse of current with a high signal-to-noise ratio is extremely desirable.

U.S. Pat. No. 5,075,629 discloses a device for detecting a partial discharge in a transformer. In particular, this patent discloses an antenna, constructed of a single solid core with a conducting wire wrapped around it, that is placed inside the transformer to detect emission of an electromagnetic wave produced by the transformer as a result of the occurrence of a partial discharge. The center of the conducting wire wrapped around the single core is grounded to produce two coils. The time-varying magnetic field of the electromagnetic wave induces two voltages in the coils that provide the input signals for a differential amplifier. The output of the amplifier signals the occurrence of a partial discharge.

The antenna disclosed in the '629 patent has a solid core that does not permit the passage of a cable therethrough. Thus, the apparatus can not be connected directly through a cable to the transformer to receive a current pulse that a partial discharge produces. Accordingly, it relies on a weaker mode of coupling, i.e., detection of the electromagnetic wave emanated from the transformer. This mode of coupling imposes the further limitation that the apparatus can not be employed outside the transformer because high voltage transformers are typically shielded by enclosures.

Some prior art techniques relate to finding the location of a partial discharge event so as to allow correction of the defect giving rise to the discharge. For example, U.S. Pat. No. 5,530,364 discloses an apparatus for detecting the location of an incipient fault in an insulated cable. In particular, the apparatus of the invention scans the surface of the cable by physically moving two separate axially spaced sensors, disposed adjacent to the surface, over the cable. A partial discharge event produces a current pulse through the cable which, in turn, produces electrical pulses at each of the two sensors. These two pulses are added to produce a resultant signal whose magnitude reaches a maximum if the partial discharge occurs at a point midway between the two sensors, thus indicating the location of the discharge.

The energy produced by a partial discharge event in a high voltage device is typically extremely small. Accordingly, it is imperative that the system designed for detecting such events provide a means of coupling to the device that has a minimal loss and also a detection means that provide a high signal-to-noise ratio. In addition, periodic monitoring of a device for partial discharges requires a system that can be easily connected to and disconnected from the device. Many prior art systems suffer from a number of limitations related to the above-mentioned desirable features that the present invention seeks to remedy. For example, the use of the apparatus of '629 patent not only employs a weak mode of coupling to the transformer but also requires opening up a transformer to place the antenna within it. The apparatus of the '364 patent is essentially a timing system for signaling the arrival of two pulses at the sensors, and does not provide new techniques for improving the signal-to-noise ratio of the detected pulses.

It should be understood that the desirability of detecting transient currents with a high signal-to-noise ratio is not limited to monitoring of partial discharges. Another possible application, for example, relates to monitoring a beam of electrons or ions used in implantation systems.

Accordingly, it is an object of the present invention to detect a transient current carried by a wire with an improved signal-to-noise ratio.

It is another object of the invention to detect a pulse of current or a beam of charged particles with an improved signal-to-noise ratio.

It is yet another object of the invention to provide a current sensor that can be easily calibrated.

It is yet another object of the invention to provide a current sensor with a broad-band and/or selectable frequency response.

It is yet another object of the invention to provide an apparatus for monitoring partial discharges in high voltage devices with an improved signal-to-noise ratio.

The invention is next described in connection with illustrated embodiments. It is obvious to those skilled in the art that various modifications to the embodiment can be made without departing from the scope and the spirit of the invention.

SUMMARY OF THE INVENTION

The invention detects a time-varying current by employing a plurality of generally toroidal coils with separate windings that are placed in close proximity of each other such that they respond to a current signal, which passes through the central aperture of the toroids, at substantially the same time. In particular, the current induces a plurality of voltages across these coils where each induced voltage indicates the detection of the current. The invention also allows combining the induced voltages, i.e., summing and/ or subtracting the voltages, to produce a resultant signal that signifies the existence of the time-varying current. A single coil of toroidal construction is sometimes referred to as a Rogowski coil.

It is well understood in physics that a changing magnetic flux within a coil induces a voltage across it. Furthermore, a current due to moving charged particles produces a surrounding magnetic field. Accordingly, a changing magnetic flux, associated with a current pulse, through the closely-spaced coils of the present invention induces a plurality of voltages across them. The spacings between the coils are selected such that each coil responds to substantially the same magnetic field. In addition, each coil is electrically insulated from the others so that each induced voltage represents an independent response to the same current. The induced voltages can be either utilized individually or can be combined in various ways, described more fully below, to produce a combined signal.

One aspect of the invention relates to selecting at least one coil to have either a winding of opposite polarity with respect to another coil or to have a winding of similar polarity but reverse output connections with respect to the other coil. Two such coils are herein referred to as having opposite polarities with respect to each other. The induced voltages across two coils having opposite polarities have opposite phases relative to each other. In addition, the close proximity of two such coils ensures that the character of noise on the induced voltage across one coil is substantially similar to that on the induced voltage across the other coil. Accordingly, subtraction of the induced voltages across two coils of opposite polarities results in addition of the two induced voltages and reduction of the noise, i.e., an improved signal to noise ratio.

The invention also allows selection of at least one coil of the plurality of closely-spaced coils as a calibration coil. The injection of a known driven current into such a calibration coil induces a current in an electrical conductor, disposed in the middle of the sensor, which in turn produces a time-varying magnetic flux in the other coils. The time-varying magnetic field induces a plurality of voltages across these coils. Because the value of the injected current in the calibration coil is known, the value of the response induced in the other coils by the injected current can be readily calculated. Thus, the measurement of the induced voltages due to the injected current provides calibration of the coils.

In another aspect of the invention, the closely-spaced coils are adapted for detection of a time-varying magnetic field that has different selected frequency regions including a wide frequency bandwidth. In particular, at least one coil is chosen to be different from the others, e.g., at least one coil is chosen to have a different number of windings and/or different core material. The response of such a coil is optimal at a particular frequency which is different from the frequencies at which the other coils exhibit their optimal responses. This results in a current sensor with a wider bandwidth and/or with simultaneous optimal responses in different frequency regions. For example, a broad-band sensor according to the invention can have one coil with a frequency response centered at 60 Hz, and another coil with a frequency response centered at 1 MHz. The invention preferably selects the coils such that the aggregate response of the coils span the frequency band-width of interest of the time-varying magnetic field. Some embodiments of the invention sum the induced voltages across the coils of such a wide-band magnetic sensor to obtain a resultant signal that signifies the presence of the time-varying current.

One important application of a wide-band current sensor relates to the detection of a transient current having a short temporal duration and being carried by an electrical conductor. This can be understood by noting that such a pulse of current has many frequency components in its frequency bandwidth. The coils can be designed such that each coil responds optimally to a selected number of these frequency components. Thus, the aggregate response of all of the coils to the transient current is more effective than the response of each individual coil.

It should be understood that production of a current sensor that incorporates all of the various features described above is within the scope of the present invention. In particular, a sensor having a plurality of coils such that at least two coils yield opposite polarities with respect to each other, or at least one coil is a calibration coil, or at least one coil has a frequency response that is different from the frequency response of the others incorporates all of the above-mentioned features.

The invention also contemplates disposing a plurality of coils on a number of cores such that each coil responds to a time-varying current at substantially the same time. According to one aspect of the invention, the coils are disposed on separate cores. The material of the cores is selected to have a high magnetic permeability, e.g., ferrite material, or air, so as to allow penetration of a magnetic field into the body of the cores. The penetration of the magnetic field into the cores results in a changing magnetic flux within the coils disposed on the cores which in turn induces a plurality of voltages across the coils. The structures of the cores can be selected, e.g., toroidal, or substantially toroidal, to provide sensors suitable for a variety of applications. The use of separate cores allows attaining separate independent signals from each of the plurality of coils in response to the same magnetic field.

It is typically desirable to select a magnetic core, on which a coil for detection of a time-varying current is disposed, to be as large as possible. The advantage of employing a large core can be understood by noting that as the size of the core increases, it intersects with larger number of magnetic field lines of a time-varying magnetic field, thus resulting in a larger magnetic flux within the core. The larger magnetic flux, in turn, results in a larger induced voltage across the coil disposed on the core, i.e., a better signal-to-noise ratio. Large magnetic cores are, however, costly and difficult to manufacture. The employment of multiple cores by the present invention achieves the advantages of utilizing a single large core, e.g., better signal-to-noise ratio, without its drawbacks, e.g., higher cost and difficulty of manufacture.

The toroidal and the quasi-toroidal structures are particularly suited for detecting a current pulse being carried on an electrical conductor. One important application of such a detection of a current pulse relates to signaling the occurrence of a fault in a high voltage device, e.g., a high voltage transformer or a high voltage electrical cable. For example, the occurrence of a partial discharge in such a high voltage device produces current pulses that can be detected by a magnetic sensor according to the present invention.

While a number of preferred embodiments of the invention employ a plurality of cores, the invention can also be practiced by employing a single core with a plurality of coils disposed thereon. A first coil is wound around the core, and subsequently successive coils are disposed on the first coil, each on top of the previous one. In addition, an electrically insulating material is disposed between any two adjacent coils to isolate them from each other so that each coil provides an independent response to a transient magnetic field. The structure of the single core on which the coils are disposed can be selected to be toroidal, and quasi-toroidal.

Similar to sensors according to the present invention that comprise a plurality of cores, a sensor with a single core and a multiplicity of coils, as explained above, can also incorporate the various aspects of the present invention. In particular, production of such a sensor having at least a pair of coils with opposite polarities, and/or having at least one calibration coil, and/or having at least one coil that is different from the others, is within the scope of the present invention.

Another aspect of the invention is to employ the multiple closely-spaced coils in conjunction with a network of capacitors, inductors, and resistors to produce a resonant electronic L-C-R circuit. The use of such a resonant circuit enhances currents at selected frequencies, and hence increases the induced voltages, thus rendering the detection of weak time-varying magnetic fields feasible. As was mentioned previously, one important application of the sensor of the invention is for detection of partial discharges in high voltage devices. Because such PD events are typically of short durations, e.g., less than a microsecond, the values of the inductance, the capacitance, and the resistance of a resonant L-C-R circuit employed in a sensor designed for detection of such events are typically selected to produce a resonant frequency in the range 30 kHz to 5 MHz.

Thus, the invention allows the differential detection of a transient magnetic field, and attains the aforementioned advantages including a better signal-to-noise ratio, a selectable bandwidth, easy calibration, and possible reduction in cost.

DETAILED DESCRIPTION

Figure 1:
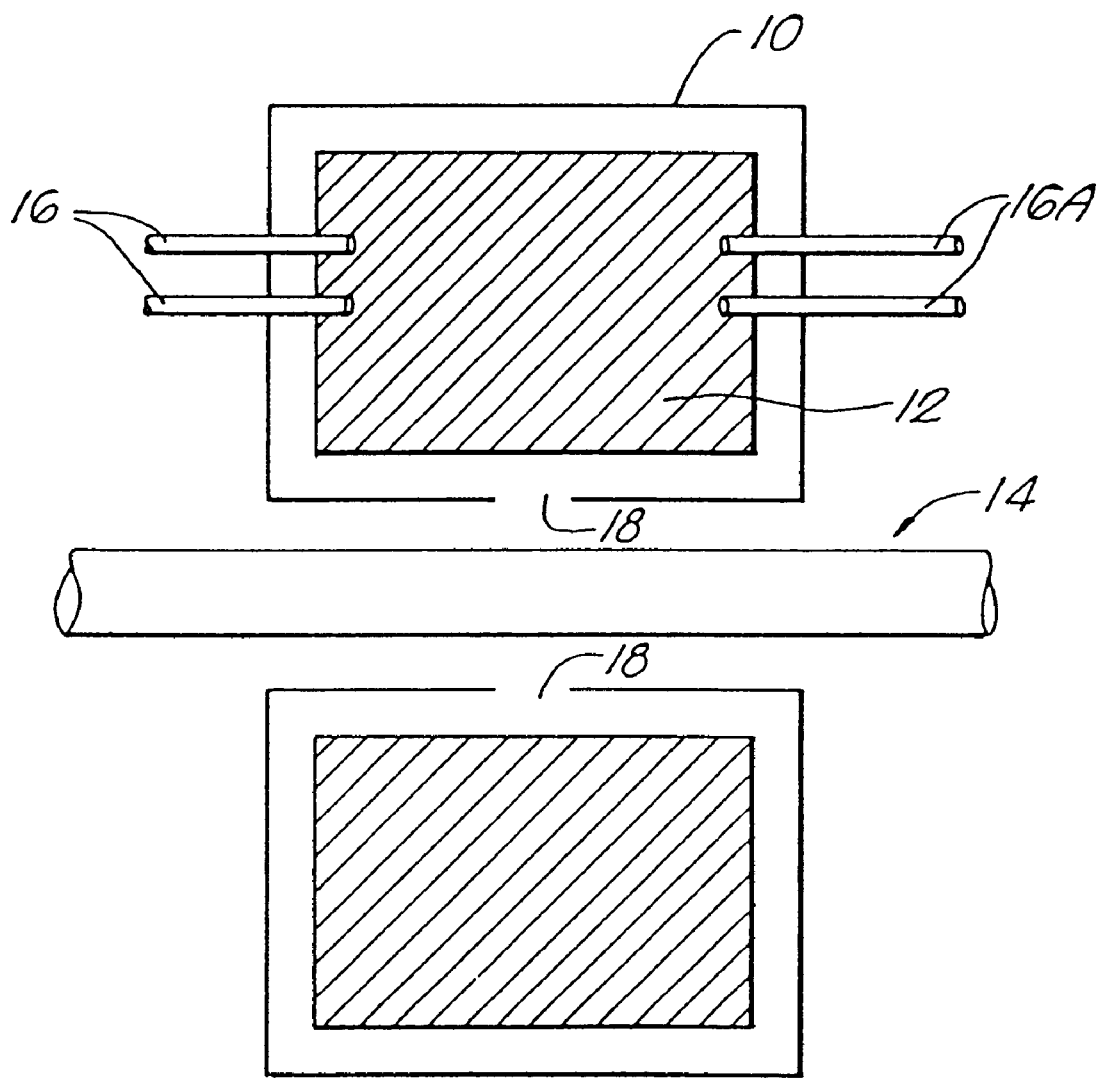
FIG. 1 depicts a cross sectional view of a sensor according to the invention that has an enclosure to house a plurality of toroidal cores, each of which has a coil, that permit the passage of an electrical conductor through their hollow centers in order to detect a current pulse carried by the conductor, and the outputs from each coil are made available as needed.

FIG. 1 illustrates a cross sectional view of an apparatus according to the invention in which a metallic shield enclosure 10 houses a number of cores 12 on each of which a conductive coil is mounted. The enclosure has an aperture that permits the passage of an electrical cable 14 therethrough. Output connections 16 and 16A provide access to the voltages induced at the terminals of the conductive coils. Gaps 18, provided in the enclosure, allow penetration of the magnetic field produced by a current carried by the cable into the coils.

Figure 2:
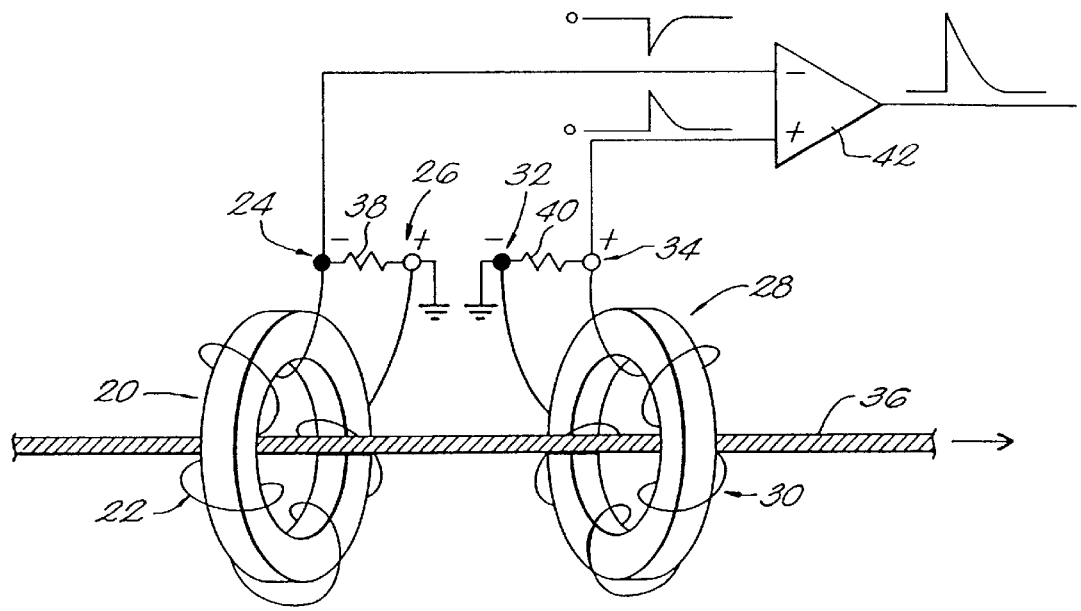
FIG. 2 is a more detailed illustration of the components of an embodiment of the apparatus shown in FIG. 1, wherein a differential amplifier produces a signal proportional to the difference of two electrical voltages with opposite phases that a current pulse induces across two toroidal coils with opposite windings but similar output connections, for clarity the distance between the two coils is exaggerated and any enclosure is not shown.

FIG. 2 is a more detailed depiction of the cores and the coils of the apparatus of FIG. 1 according to one preferred embodiment, illustrating two separate cores, namely core 20 with a coil 22 disposed thereon and having terminals 24 and 26, and core 28 with coil 30 disposed thereon and having terminals 32 and 34. The cores have toroidal structures with hollow centers that allow the passage of an electrical conductor 36 therethrough. The distance between the two coils in the figure is exaggerated for clarity, and the enclosure is not shown. In practice, the two coils are placed in close proximity of each other such that they both detect the same magnetic field.

In one application of this embodiment, for example in monitoring partial discharges, a pulse of current passes through the conductor and induces two voltages across the two coils. The polarity of the winding of one coil is selected to be opposite of the other. Terminals 26 and 32 are grounded, and the voltages induced across the other two terminals, i.e., terminals 24 and 34 have opposite phases relative to each other. Two resistors 38 and 40 are connected across the output terminals of coils 22 and 30, respectively. The values of the resistance of these resistors are chosen to influence the frequency response of the apparatus. A differential amplifier 42 receives the voltages induced at terminals 24 and 34 at its input terminals and produces an output voltage that is proportional to the difference of the two input voltages.

Figure 2A:
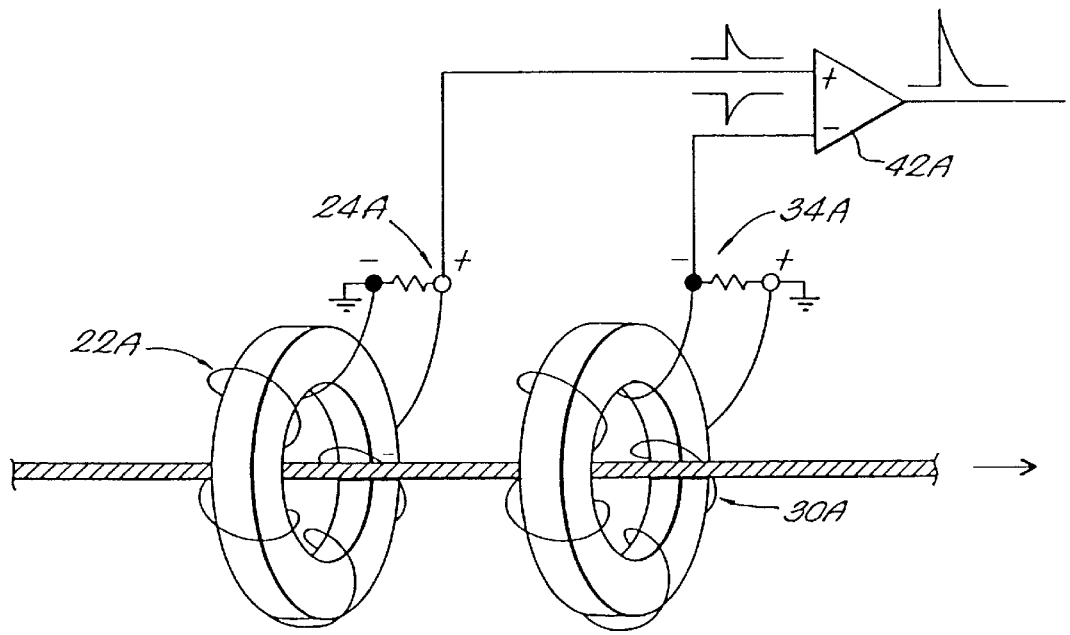
FIG. 2A depicts a sensor similar to that shown in FIG. 2 except that the two coils have similar windings and reverse output connections, thus producing two induced voltages with opposite phases that are inputted into a differential amplifier.

FIG. 2A illustrates an embodiment that similar to the embodiment of FIG. 2 employs two separate toroidal cores, on each of which a coil is disposed. Unlike the previous embodiment, however, the polarities of the windings of the two coils are selected to be the same, but the polarity of the output connections are reversed. For example, if a transient magnetic field induces a positive voltage at terminal 24A of coil 22A, it will induce a negative voltage at terminal 34A of coil 30A. A differential amplifier 42A receives at one input terminal the positive voltage induced at one terminal of one of the coils, and at its other input terminal the negative voltage induced at the opposite terminal of the other coil, and produces a voltage proportional to their difference.

Figure 2B:
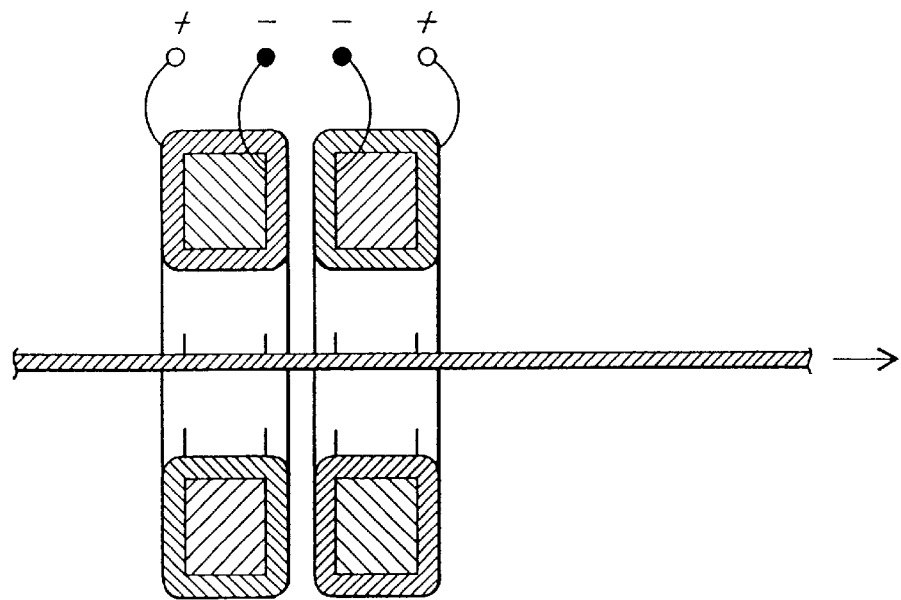
FIG. 2B is a cross-sectional view of FIG. 2.
Figure 2C:
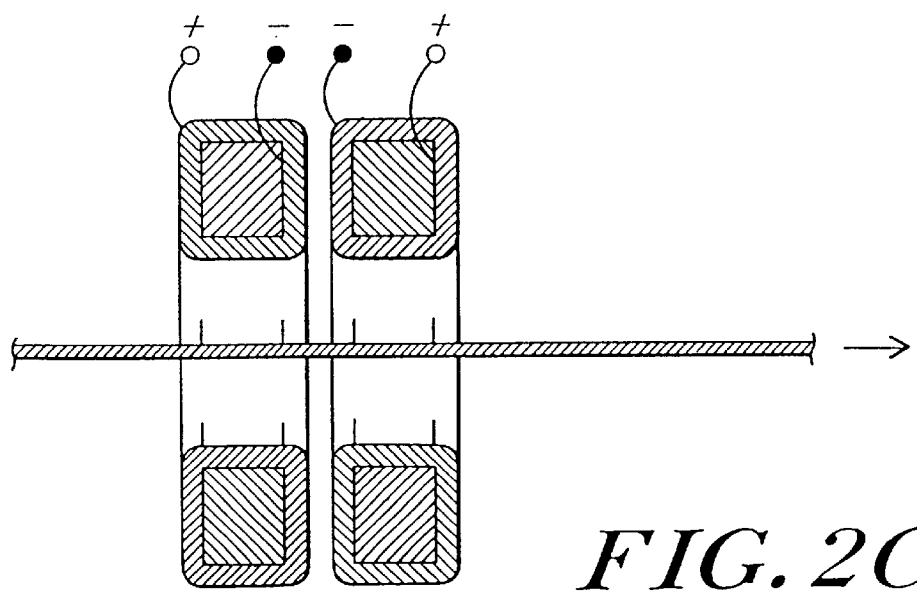
FIG. 2C is a cross-sectional view of FIG. 2A.

FIGS. 2B and 2C are cross-sectional views of the cores and the coils of the sensors shown in FIGS. 2 and 2A, respectively, presented to illustrate further that the invention can produce induced voltages with opposite phases in response to the same time-varying magnetic field in two different manners. In particular, the coils of FIG. 2B are selected to have opposite windings but similar output connections so that the induced voltages across them have opposite phases. The sensor of FIG. 2C, however, accomplishes the same result by selecting the two coils to have similar windings but reverse output connections.

Figure 3:
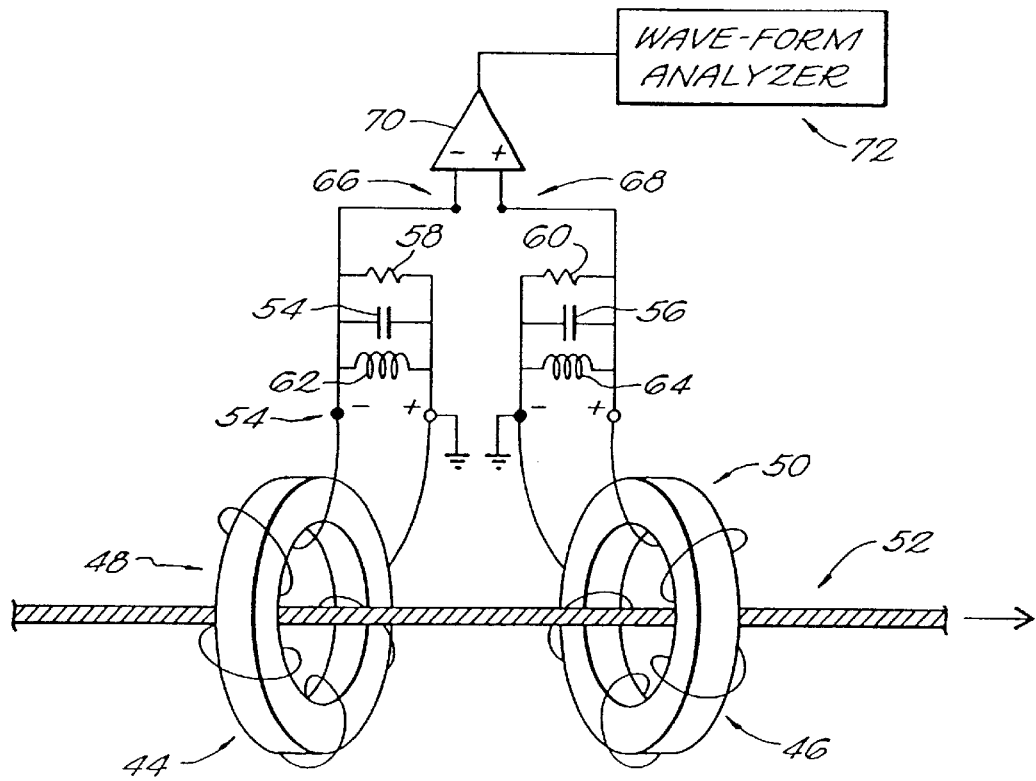
FIG. 3 shows a sensor according to the invention that employs two separate cores having two coils of opposite polarities, and a network of inductors, capacitors and resistors to differentially detect a transient magnetic field.

FIG. 3 illustrates an embodiment of the invention that utilizes a network of inductors, capacitors, and resistors to enhance the voltage induced across a plurality of coils disposed on separate toroidal cores as a result of the passage of a current pulse through the hollow center of the toroids. In particular, two coils 44 and 46 are disposed on two cores 48 and 50, respectively. The coils have opposite windings to produce two voltages with opposite polarities in response to the same transient magnetic field.

An electrical conductor 52 passes through the hollow cavity at the center of the cores and carries a current pulse. In one application of this embodiment, the conductor is connected to a high voltage device which creates a current pulse as a result of the occurrence of a partial discharge. This current pulse produces a magnetic field that penetrates within the cores and creates a time-varying flux within each coil, thus inducing a voltage across each coil. Because the two coils have opposite windings, the induced voltages across the two coils have opposite phases relative to each other. Thus, a positive voltage is induced at the un-grounded terminal of one coil and a negative voltage at the corresponding terminal of the other coil.

Further reference to FIG. 3 shows two identical capacitors 54 and 56, each connected electrically in parallel with one of the coils. Two identical resistors 58, and 60 are connected electrically in parallel with the capacitors 54 and 56, respectively. Further, two identical inductors 62 and 64 are connected electrically in parallel with the resistors 58 and 60, respectively. The capacitance, the inductance, and the resistance of the capacitors, resistors and the inductors are selected in a manner known in the art such that the combination of each coil with its associated capacitor, resistor, and inductor produces a resonant circuit with a resonant frequency in the range 30 kHz to 5 MHz. The induced voltages in the coils produce two voltages at terminals 66 and 68.

Referring again to FIG. 3, a differential amplifier 70 receives the induced voltages at terminals 66 and 68 at its input terminals, and produces an output signal proportional to the difference between the two input voltages. Because the two input voltages are 180 degrees out of phase, the magnitude of the output signal is proportional to the sum of the magnitude of the two input signals whereas the root mean square magnitude of the noise carried on the output signal is lower than the sum of the root mean square magnitude of the noise on each of the two input signals. Accordingly, the signal-to-noise ratio of the output signal is higher than that of the input signals. The differential amplifier can be replaced with a balanced center-tapped transformer to achieve the same result.

If the apparatus is utilized for monitoring a partial discharge, a waveform analyzer 72 receives the output signal of the differential amplifier and analyzes the waveform associated with the current pulses in search of the fingerprints of a partial discharge event in a manner well-known in the art. Once such a signal is found, the waveform analyzer signals the occurrence of the event.

Figure 4:
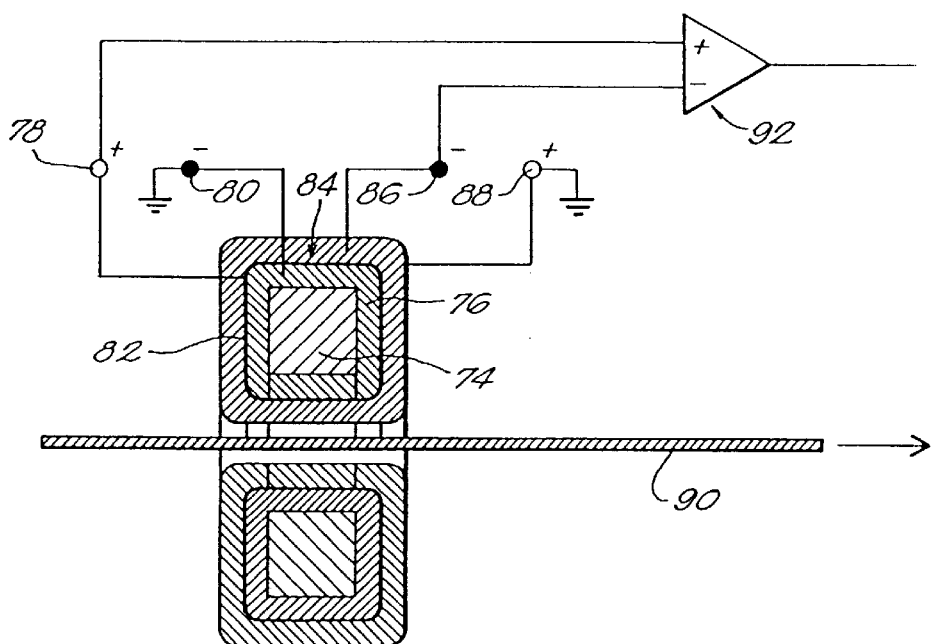
FIG. 4 is a cross-sectional view of an embodiment of the invention that utilizes a single toroidal core with two coils with opposite windings disposed thereon to differentially detect a transient magnetic field.

As was describe previously, the practice of the invention is not limited to employing a plurality of cores. In particular, FIG. 4 illustrates a cross-sectional view of an embodiment of the invention that employs a single core 74 with a toroidal shape. The core has a high magnetic permeability, e.g., a ferrite material, or an air core, to allow penetration of a magnetic field into the core. A first coil 76 is disposed directly on the core with two output terminals 78 and 80. An electrically insulating material 82, e.g., polyethylene, is disposed on the first coil, and subsequently a second coil 84 is disposed on this insulating material with two output terminals 86 and 88. Terminals 80 and 88 are grounded. The insulating material ensures that the coils respond independently to the same time-varying magnetic field. The polarities of the windings of the two coils are selected to be opposite to each other. Accordingly, an induced voltage at the terminal 78 of the first coil, produced for example by a current passing through a conductor 90, is opposite in phase with respect to the voltage at the terminal 86 of the second coil. The same type of phase relationship exists between the other two terminals of the two coils. A differential amplifier 92 receives two induced voltages with opposite phases and produces an output voltage proportional to their difference. Thus, this embodiment also allows a differential detection of a time-varying magnetic field.

Figure 5:
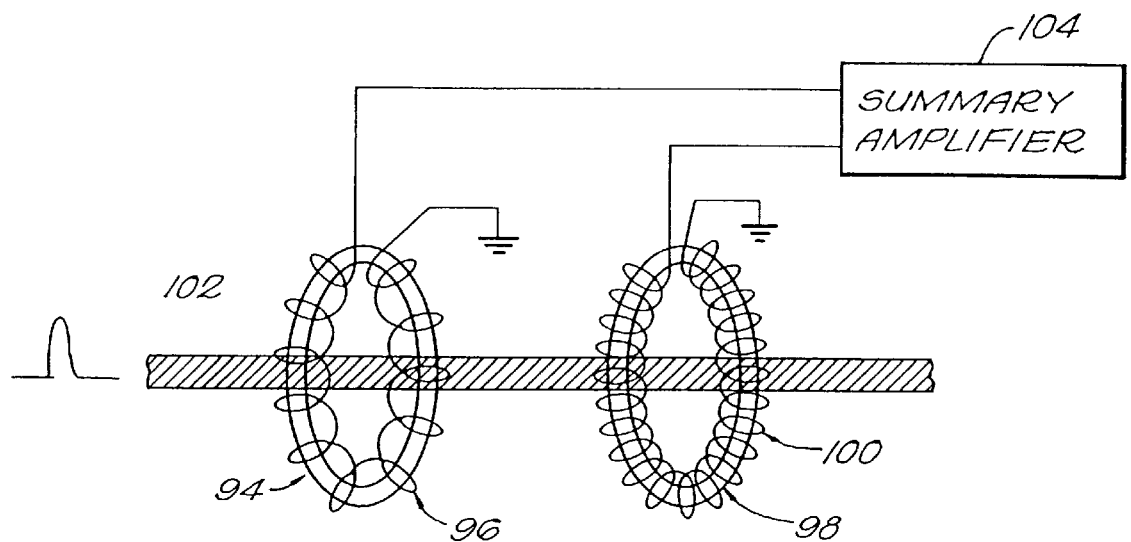
FIG. 5 illustrates a sensor that provides a selectable band-width response to a transient current by employing two dissimilar coils disposed on two separate cores.

As was described previously, one aspect of the present invention relates to producing a sensor with a wide-band frequency response and/or frequency response selected in particular bandwidths. FIG. 5 illustrates a wide-band sensor according to the invention in which a toroidal core 94 with a coil 96 disposed on it is placed in close proximity of another toroidal core 98 on which a coil 100 is disposed. The two cores are closely-spaced so that each coil responds to a magnetic signal substantially at the same time. The windings of the two coils have the same polarity, but the two coils are made intentionally dissimilar. For example, the two coils can be selected to have different number of turns. This results in each coil having a bandwidth of response to a transient magnetic field which is different from that of the other. Thus, the sensor as a whole has a bandwidth which is wider than that of each coil.

One application of such a sensor is in detecting a short current pulse that is carried on an electrical conductor. Referring again to FIG. 5, such a pulse of current being carried on a conductor 102, disposed in the hollow centers of the cores, produces a time-varying magnetic flux within each coil. The time-varying flux in turn induces two voltages across the two coils. A summing amplifier 104 adds these two induced voltages to produce a resultant voltage. The Fourier transform of the temporal profile of the pulse comprises of a number of components. Because the two coils are selected to be different, each responds preferentially to a particular set of these components. Thus, the two coils jointly respond to the current pulse more efficiently than a sensor with two identical coils.

It should be understood that the coils of any of the embodiments described above can be made dissimilar in order to construct a wide-band and/or selectable band-width magnetic sensor. Thus, toroidal, and quasi-toroidal structures can be employed to construct a wide-band sensor of time-varying magnetic fields.

Figure 6:
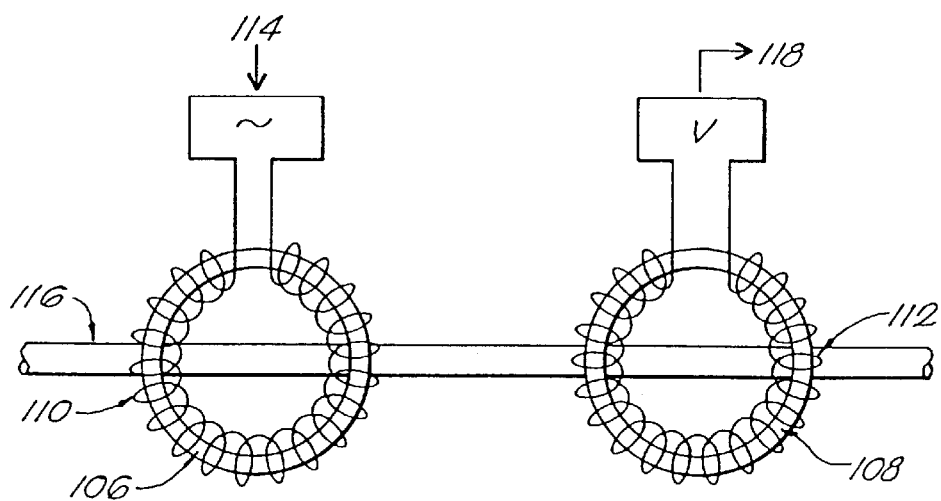
FIG. 6 is an illustration of a magnetic sensor with two separate cores, each having a coil, wherein one of the coils is employed for calibration of the other.

FIG. 6 is yet another embodiment of the invention that illustrates a magnetic sensor with a provision for easy calibration. In particular, reference to FIG. 6 shows two separate toroidal cores, 106 and 108, disposed in close proximity of each other, and having coils, 110 and 112, disposed thereon. The coil wound on the core 106 is employed for calibration purposes. In particular, further reference to FIG. 6 illustrates a signal generator 114 that injects a known driven current into the calibration coil. The current produces a magnetic field within the core which in turn produces a current through a conductor 116 disposed in the hollow centers of the two cores. This current produces a known magnetic flux through the other core that induces a voltage across the coil 112. A measurement of this induced voltage by a voltmeter 118 leads to calibration of the sensor.

The above descriptions of the various embodiments should be interpreted as illustrative and not in a limiting sense. It is obvious to those skilled in the art that many variations can be made to the embodiments described above without departing from the scope and the spirit of the invention. In particular, although many of the described embodiments were presented with two coils, it should be understood that the practice of the invention is not limited to employing only two coils. A plurality of coils with separate windings and disposed on separate cores or on a single core, according to the methods of the invention, can be employed to effectuate the objectives of the invention.

Thus, the invention attains the objectives set forth above by employing a plurality of closely-spaced coils that respond independently to the same time-varying magnetic field.

Having described the invention, what is claimed as new and protected by Letter Patent is:

1. Apparatus for detecting a current pulse in an electric power system, said current pulse being carried by an electrical line, said apparatus comprising a plurality of electrically conducting coils, each coil being electrically insulated from the others, and each coil being disposed on a separate core having a toroidal structure with a hollow center to allow the passage of said electrical line through the hollow centers, said cores being disposed in close proximity of each other such that said current pulse in the electrical line passing through the hollow centers induces a voltage across each of said coils at substantially the same time, and means for differentially combining said induced voltages to obtain a resultant signal, thereby indicating the passage of said current pulse.

2. The apparatus of claim 1, wherein said cores are formed of high magnetic permeability material.

3. The apparatus of claim 1, wherein said cores and said coils are housed in a highly conductive enclosure, said enclosure having at least one gap to allow penetration of magnetic flux into said cores and said coils.

4. The apparatus of claim 1, wherein at least a first coil among said coils has an opposite polarity with respect to a second coil among said coils whereby the induced voltage across the first coil has a first phase and the induced voltage across the second coil has a second phase, said first phase being the opposite of said second phase.

5. The apparatus of claim 4, wherein said means for combining said induced voltages comprises means for summing the voltages with said first phase to obtain a first signal and summing the voltages with said second phase to obtain a second signal, and means for differential detection of said first and second signals.

6. The apparatus of claim 5, wherein said means for differential detection comprises a transformer with balanced center-tapped input and unbalanced output receiving said first and second signals at its input terminals to produce an output signal proportional to the difference between said first and second signals.

7. The apparatus of claim 5, wherein said means for differential detection comprises a differential amplifier receiving said first and second signals at its input terminals to produce an output signal proportional to the difference between said first and second signals.

8. The apparatus of claim 1, wherein a fault in a high voltage device generates said current.

9. The apparatus of claim 8, wherein said high voltage device comprises a high voltage electrical cable.

10. The apparatus of claim 8, wherein said high voltage device comprises a transformer.

11. Apparatus for detecting a current pulse, said current pulse being carried by an electrical line, said apparatus comprising a plurality of electrically conducting coils, each coil being electrically insulated from the others, and each coil being disposed on a separate core having a toroidal structure with a hollow center to allow the passage of said electrical line through the hollow centers, said cores being disposed in close proximity of each other such that said current pulse in the electrical line passing through the hollow centers induces a voltage across each of said coils at substantially the same time, wherein at least one of said coils is a calibration coil and means for differentially combining said induced voltages to obtain a resultant signal, thereby indicating the passage of said current pulse.

12. A method for detecting a current pulse in an electric power system, said method comprising the steps of providing a plurality of electrically conducting coils on separate cores such that each core has a coil, said cores having toroidal structures with hollow centers to allow the passage of an electric power electrical line therethrough, disposing said cores in close proximity to each other such that each of said coils responds to said pulse at substantially the same time, whereby said pulse induces a plurality of voltages across said coils, and differentially combining said induced voltages to obtain a resultant signal that indicates the passage of said pulse of current.

13. The method of claim 12, further including the step of combining said induced voltages to produce a resultant voltage.

14. The method of claim 12, further including the step of selecting at least a first coil among said coils to have an opposite polarity with respect to a second coil among said coils, whereby the induced voltage across said first coil has a first phase and the induced voltage across said second coil has a second phase, said first phase being the opposite of said second phase.

15. The method of claim 14, further comprising the steps of summing the voltages with said first phase to obtain a first signal and summing the voltages with said second phase to obtain a second signal, and subtracting said first signal from said second signal.

16. The method of claim 12, wherein a partial discharge in a high voltage device produces the pulse of current.

17. The method of claim 12, further comprising the step of disposing a plurality of electrically conducting coils having separate windings in close proximity of each other such that said coils respond to said pulse at substantially the same time, wherein at least one of said coils has a frequency response to said pulse that is different from the frequency response of another of said coils, whereby said pulse induces a plurality of voltages across said coils, wherein each induced voltage indicates the passage of said current pulse.

18. The method of claim 17, further comprising the step of combining said induced voltages to produce a resultant signal.

* * * * *